United States Patent
Ge et al.

(10) Patent No.: US 9,989,591 B2
(45) Date of Patent: Jun. 5, 2018

(54) API-BASED PATTERN-CONTROLLED TEST ON AN ATE

(71) Applicant: Advantest Corporation, Tokyo (JP)

(72) Inventors: Liang Ge, San Jose, CA (US); Jia-Min Wang, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 486 days.

(21) Appl. No.: 14/687,259

(22) Filed: Apr. 15, 2015

(65) Prior Publication Data

US 2015/0293174 A1    Oct. 15, 2015

(30) Foreign Application Priority Data

Apr. 15, 2014  (CN) .......................... 2014 1 0152088

(51) Int. Cl.
| | |
|---|---|
| G06F 11/22 | (2006.01) |
| G06F 17/50 | (2006.01) |
| G01R 31/3177 | (2006.01) |
| G01R 31/319 | (2006.01) |
| G01R 31/28 | (2006.01) |
| G06F 11/273 | (2006.01) |

(52) U.S. Cl.
CPC ..... *G01R 31/3177* (2013.01); *G01R 31/2834* (2013.01); *G01R 31/31907* (2013.01); *G01R 31/31908* (2013.01); *G06F 11/2736* (2013.01)

(58) Field of Classification Search
USPC .......................................................... 716/136
See application file for complete search history.

(56) References Cited

U.S. PATENT DOCUMENTS

| | | | |
|---|---|---|---|
| 2010/0042959 A1* | 2/2010 | Bhinge | G06F 11/263 716/136 |
| 2012/0216080 A1* | 8/2012 | Bansal | G06F 11/3476 714/45 |
| 2012/0317534 A1* | 12/2012 | Bhinge | G06F 11/263 716/136 |

* cited by examiner

*Primary Examiner* — Brian Ngo (57) ABSTRACT

Method and apparatus for performing Pattern-Controlled tests on an automatic test equipment (ATE). The ATE includes a diagnostic instrument and a control device. An application programming interface (API) is installed in the control device and operates to interact with a test program and thereby automatically controls the diagnostic instrument to perform a test. The test program is coded in a high-level programming language and defines a plurality of operation events for the test based on user input. The API identifies the operational events and determines respective operational types associated therewith. Events of an operational type are assigned to a respective pattern label. The pattern labels are then aggregated into a pattern burst which is downloaded to the diagnostic instrument.

20 Claims, 6 Drawing Sheets

API-BASED PATTERN-CONTROLLED TEST ON AN ATE

CROSS REFERENCE

This application claims priority to and benefit of Chinese Patent Application No. 201410152088.9, filed on Apr. 15, 2014, titled "API BASED PATTERN CONTROLLED MEASUREMENT ON ATE," the content of which is incorporated herein by reference in its entirety.

TECHNICAL FIELD

Embodiments of the present disclosure relate generally to the field of automatic testing equipment (ATE), and in particular to automatic control mechanisms of ATE.

BACKGROUND

In semiconductor manufacturing, automatic test equipment (ATE) is used to test integrated circuit (IC) devices, e.g., to characterize electrical properties, detect abnormalities, and evaluate product quality. During testing operations, stimulus signals are generated and provided to devices under test (DUTs) and the resultant output signals generated from the DUTs are evaluated against the expected values.

A test on modern electronic devices may involve a complex sequence of operations. For example, to verify if a radio frequency (RF) transceiver chip in a global system for mobile communication (e.g., GSM) can respond properly to a stimulation signal, a test on the chip may include the following operations, for instance:
  sending a −20 dBm, 850 MHz, GSM signal to the "LNA" pin of the chip;
  waiting for 2 ms;
  capturing 1024 points with a sampling frequency (FS) of 1 MHz at the "BB" pin of the chip;
  supplying a DC (direct current) voltage of 3V in "VDD" pin of the chip;
  measuring a voltage at "Vref" pins of the chip; and
  capturing 100 samples in the "DPO" pin of the chip.

Figure 1:
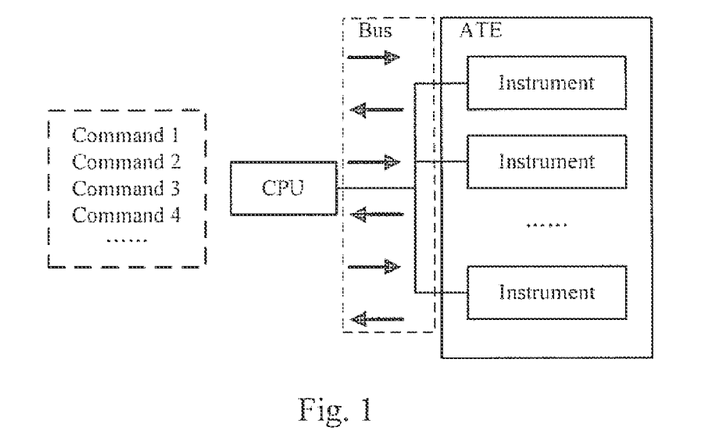
FIG. 1 illustrates a system configured for a conventional approach of CPU-Controlled test.

Traditionally, two approaches can be used to control the diagnostic instruments on an ATE and implement such a test. In the so-called "CPU-Controlled test" approach, as illustrated in FIG. 1, an engineer or another type of user generates code (e.g., a script or a software program) using an high-level language Application Programming Interface (API) based on the debug tool and the operating environment running on a work station. The code is interpreted as commands to be executed by the ATE to carry out the sequence of operations above. The commands are then transmitted via a bus between the work station and the ATE in real-time during a test procedure. Thus, the ATE (through one or more of its diagnostic instruments) performs the sequence of test operations based on the commands.

Figure 2:
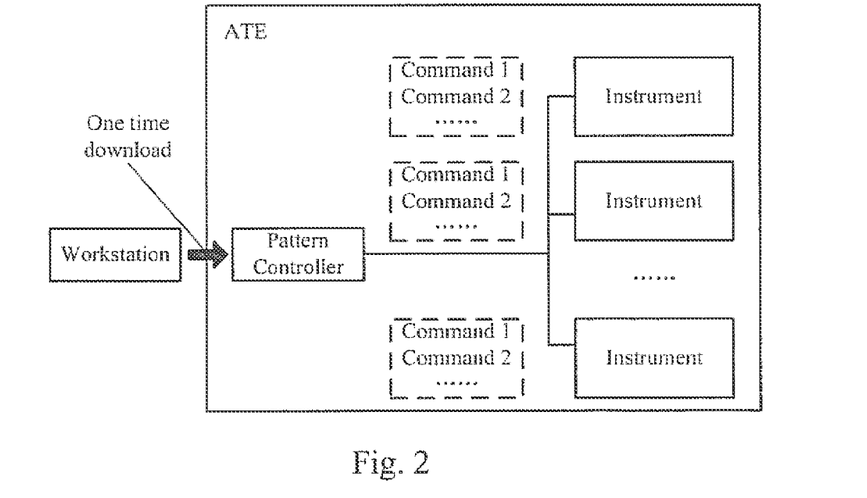
FIG. 2 illustrates a system configured for a conventional approach of Pattern-Controlled test.

In the so-called "Pattern-Controlled test" approach, as illustrated in FIG. 2, a user generates a list of commands on the work station, typically through a graphical user interface (GUI), for configuring various components of the ATE. The commands are then downloaded to a pattern controller in the ATE prior to a test. The pattern controller aligns the commands so that the various ATE components involved in the tests can operate in proper timing as specified in the commands. During the test, the aligned commands will be implemented by a test processor in each of the test instruments.

The CPU-Controlled test approach allows a user to easily program and debug a test. However, because commands have to be transmitted to the ATE via a bus during a test, the limited bandwidth of the bus may cause data traffic congestion and negatively impact test time and reliability.

By comparison, the Pattern-Controlled test approach is faster and more reliable. However, a user has to use a software tool to configure a test, typically through multiple graphical user interfaces (GUI) windows that are respectively directed to different aspects of the test. The user has to be well versed in miscellaneous lower level subsystem commands and provides input through various GUI windows, which makes the setup and debug of the test very difficult.

SUMMARY OF THE INVENTION

Therefore, it would be advantageous to provide a test configuration mechanism offering reduced configuration complexity and improved test reliability and efficiency.

Embodiments of the present disclosure employ an application programming interface (API) installed in a controller of an ATE to interact with a test program and thereby generate a test pattern burst. The test program is programmed in a high-level language and defines a plurality of operation events for a test based on user input. The API identifies the operational events and determines respective operational types associated therewith. Events of an operational type are assigned to a respective pattern label. The pattern labels are then aggregated into a pattern burst which is downloaded to the diagnostic instrument and used to automatically configure the diagnostic instrument for a test.

According to one embodiment of the present disclosure, a computer implemented method of testing an electronic device using an automatic testing equipment (ATE) comprises: accessing a test program coded in a high level programming language; and identifying a plurality of operational events defined in the test program. Based on the test program, the plurality of operational events are classified into one or more operational types. A respective pattern label is assigned to each of the one or more operational types. The operational events are inserted to corresponding pattern labels, respectively. The pattern labels are then aggregated into a pattern burst. The pattern burst may be downloaded to a diagnostic instrument in the ATE and used to automatically configure the instrument for a test. The operational types may be selected from a direct-current (DC) operation type, an analog operation type, a digital operation type, an radio frequency (RF) operation type, a protocol operation type.

According to another embodiment of the present disclosure, an automatic testing equipment comprises: a diagnostic instrument; and a pattern controller coupled to diagnostic instrument and configured to automatically control the diagnostic instruments. The pattern controller comprises: a processor; and memory coupled to the processor and comprising instructions, when executed by the processor, that implement an application programming interface (API) for controlling the diagnostic instrument. The API, when invoked in a software application executed on a processor, is configured to perform a method of: (1) accessing the software application configured to control the ATE to perform a test process, wherein the software application is coded in a high level language; (2) identifying a plurality of operational events defined in the test process based on the software application; (3) determining respective operational types of the plurality of events; (4) generating pattern labels for the respective operational types; (5) associating each of the plurality of operational events to a corresponding pattern label; and (6) generating a pattern burst comprising the pattern labels.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

API-Based Pattern-Controlled Test on an Ate

Figure 3:
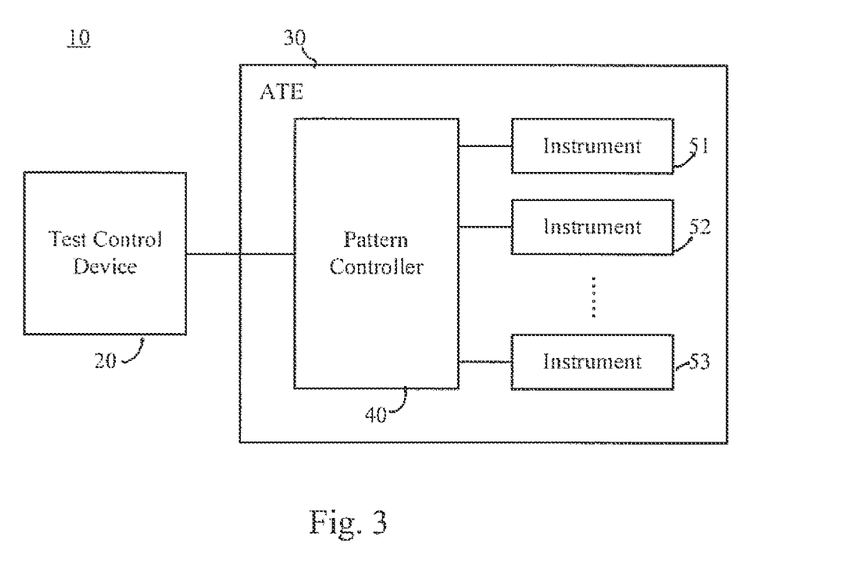
FIG. 3 shows an exemplary testing system used to configure and perform a test according to an embodiment of the disclosure.

FIG. 3 shows an exemplary test system 10 used to configure and perform a test according to an embodiment of the disclosure. The test system 10 includes a test control device 20 and an automatic testing equipment (ATE) 30 coupled to each other. The test control device 20 may be any computing device, e.g. a general purpose computer or a work station. The ATE 30 includes a pattern controller 40 coupled to the test control device 20 and test instruments, e.g., 51, 52, 53 . . . , coupled to the pattern controller 40. Though three instruments are shown in FIG. 1, it will be appreciated by a person skilled in the art that any number of test instruments may be utilized depending on test requirements and capabilities of the ATE.

Figure 4:
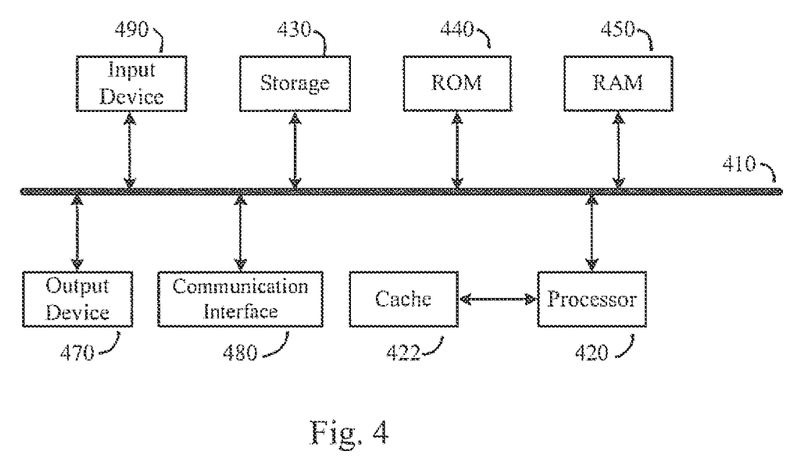
FIG. 4 is a block diagram showing the configuration an exemplary test control device including an API according to an embodiment of the present disclosure.

FIG. 4 is a block diagram showing the configuration an exemplary test control device including an API according to an embodiment of the present disclosure. The pattern controller 40 may include same or similar components shown in FIG. 4. The test control device 20 includes a bus 410 coupling various components as described below. The test control device 20 includes a processor 420, which may be one or more central processing unit(s) each having one or more processing cores, graphical processing unit(s) or other processing element(s), e.g. digital signal processor (DSP), application specific integrated circuit (ASIC) or field programmable gate array (FPGA). The test control device 20 may include a cache 422 coupled to the processor 420 or integrated as a part of the processor 420. The test control device 20 includes a system memory, for example read only memory (ROM) 440 and random access memory (RAM) 450. The test control device 20 may further include a storage device 430, which may be a non-volatile computer-readable medium, such as an optical disk, a magnetic disk (e.g. hard disk or floppy disk), an opto-magnetic disk, a flash memory, and the like. According to the present disclosure, instructions that implement a set of APIs (e.g., a SmartRDI as described in greater detail below) may be stored in the storage device 430 and, when executed by the processor 420, cause the processor to perform a method as described with reference to FIG. 5-7. Test data may be copied to the cache 422 from storage 430, ROM 440 or RAM 450 to avoid delay in the processor 420 waiting for data and thereby improve the overall performance.

The test control device 20 may include at least one input device 490 for interaction between a user and the test control device 20. The input device 490 may include, for example, a keyboard, a keypad, a mouse, a motion input, an image capturing element, a gravity sensor, a voice receiving element, or a touch screen, and so on. The test control device 20 may include at least one output device 470, which may be common output mechanisms as well known to those skilled in the art, e.g. a speaker, a beeper, a flash light, an image projecting element, a vibration output element, a display, screen, or a touch screen, etc. The test control device 20 may include a communication interface 480 for data communication in a wired or wireless manner. For example, the communication interface 480 may include an antenna for transmitting and receiving data based on various cellular protocols, Wi-Fi, Bluetooth, infrared, or Near Field Communication (NFC), and/or include a hardware connection based on TCP/IP, SCSI, IDE (including E-IDE), USB (including micro-USB, mini-USB, etc.), FireWire, HDMI, Lightning, and the like. The interface 480 may also include a bus coupled between the test control device 20 and the ATE 30 or, more specifically, the pattern controller 40 in the ATE 30.

Figure 5:
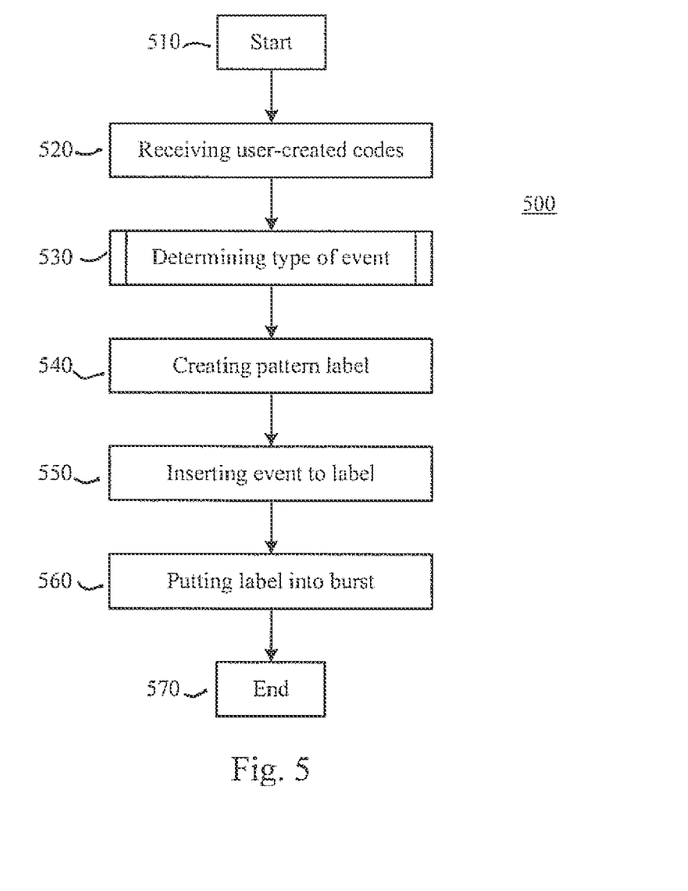
FIG. 5 is a flowchart showing an exemplary computer implemented method of configuring a pattern-controlled test according to an embodiment of the disclosure.

FIG. 5 is a flowchart showing an exemplary computer implemented process 500 of configuring a pattern-controlled test according to an embodiment of the disclosure. The process 500 can be implemented as an API installed in the test control device 20 in FIG. 3 or in the pattern controller 40 in FIG. 4, or a combination thereof, for example. As shown in FIG. 5, the process 500 starts at 510. At 520, the user-generated code (or test program) is received. The code may be generated using a high level language (e.g. C, C++, Java, .NET, etc.). The code may be input by a user from the input device 490 of FIG. 4, or accessed from the storage device 430 or remotely from an external source via the communication interface 480. The code represents instructions that, once executed by a processing device, cause the processing device to generate operational commands. The operational commands are recognizable by the ATE 30 and instruct the ATE to perform the test by carrying out a sequence of operations. According to embodiments of the present disclosure, the code defines a plurality of operational events of one or more types.

Figure 6:
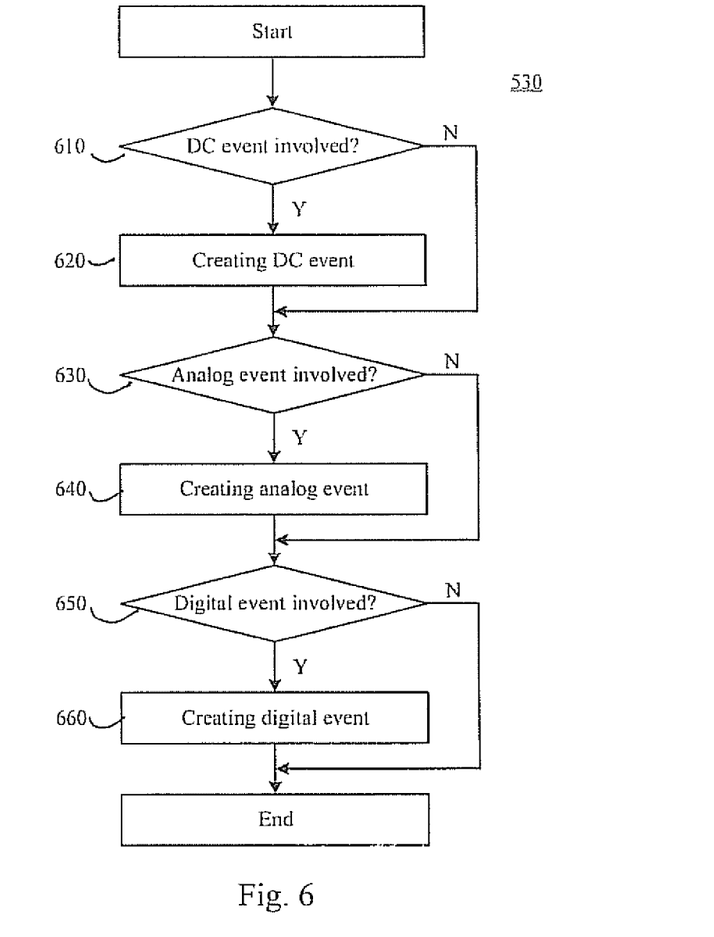
FIG. 6 shows an exemplary process of determining types of events that are defined in a test program according to an embodiment of the present disclosure.

At 530, the operational events defined in the code are identified and classified into types, which may be performed according to the exemplary process shown in FIG. 6. FIG. 6 shows an exemplary process of determining types of events that are defined in a test program according to an embodiment of the present disclosure.

At 610, it is determined whether the code defines any direct-current (DC) event for the test. If so, at 620, one or more DC events are generated based on the code. For example, a DC event may correspond to applying a DC voltage or a DC current to a pin of the DUT, measuring a voltage or current at a pin, or the like. If no DC event is indicated in the code, 620 is skipped.

At 630, it is determined whether the code defines any analog event for the test. If so, at 640, one or more analog events are generated based on the code. For example, an analog event may correspond to setting digital hardware parameter, setting a sequence program, setting the sampling frequency (FS) and system clock, setting a hardware trigger, setting a sampling parameter, or the like.

At 650, it is determined whether the code defines any digital event for the test. If so, at 660, one or more digital events are generated based on the code. For example, a digital event may correspond to a drive or compare event, a digital capture event, or the like.

Although the determinations of various types of events are illustrated as being made in a particular order in FIG. 6, it will be appreciated that the order is illustrative only and not limiting. Instead, the determination process may be made in any suitable order. In some embodiments, respective types of events can be identified in parallel. Moreover, depending on the specific test to be performed, various other types of events may be defined in the code and thus generated, e.g. RF events or protocol events. Various events are well known to those skilled in the art and so are not described in detailed herein.

Referring back to FIG. 5. At 540, a label (or pattern) is assigned each type of event involved in the test program. For example, if it is determined that the test involves DC events and analog events, two labels representing DC type and analog type respectively are defined. At 550, the events are inserted to (or associated with) the labels based on their types. For example, the DC events are inserted into the DC label, and the analog events are inserted into the analog label. Each label corresponds to a pattern. Herein, the terms of "label," "pattern" and "pattern label" are used interchangeably unless specified otherwise.

It should be noted that the processes at 540 and 550 are not necessarily performed after the types of events are identified at 530. In some embodiments, labels of all the available types are first generated, and the events defined in the code are identified and inserted to their corresponding labels. Alternatively, determination of event types and generation of labels may be performed in parallel. For example, during event generation, if it is determined that an event is of a type different from the events that have been labeled, a new label is generated for this type.

At 560, the labels with the inserted events are defined as a burst. At 570, the process 500 ends. As used herein, a "burst" refers to a sequence of patterns, each pattern including one or more events. The burst may then be downloaded to the respective test instruments (e.g., 51-53 in FIG. 3) in the ATE so that firmware in the instruments can be configured according to the downloaded burst and proper timing corresponding to the burst. As a result, the instruments can generate test signals provided to a DUT.

As an example, considering the test for an RF transceiver chip in a GSM as described previously. In a test program configured for a conventional Pattern-Controlled test according to the prior art, although only six operations are to be performed in the test, a user may have to manually configure the test and provide input via several GUI windows that are respectively directed to DC, analog, digital, RF types of events. For instance, a configuration process includes the following actions that require user input:

generating analog setting
setting digitizer hardware setting
setting sequence program
setting the sampling frequency FS and check main clock
adding digitizer trigger to pattern
putting dummy repeat for allowing the digitizer to finish data capture
generating frequency list
generating stimulation set
setting sequence block
adding RF trigger in pattern
adding arbitrary wave generator (AWG) trigger in pattern
checking the period
calculate the repeat number
adding the wait repeat in pattern adding DC test point in pattern
adding dummy lines (e.g. 32)
generating sub label
calling the sub label in pattern
using PPMU API to generate the measurement
using Pattern Controller API to set sub label
setting digital capture vector in pattern
generating digital capture setting
generating digital capture variable.

In this approach, the user has to be well versed in lower level subsystem commands and configure the test through a variety of GUI windows. A user often has to repeatedly align the timing of the DC events, analogy events, etc. Thus, it is very time-consuming and cumbersome to implement and debug a test.

In contrast, in accordance with an embodiment of the present disclosure, the same test can be automatically configured by executing the commands derived from the following code that is programmed in a high-level language:

```
ON_FIRST_INVOCATION_BEGIN( );
  TEST_BEGIN( );
    test.func( ).label("mode").execute( ); //run "mode" pattern
    test.rfs( ).pin("LNA").signal(TA::MOD).wave(gsm).freq(850e6).
    power(-20).execute( );
//send the GSM signal
    test.wait(2 ms) //wait
    test.dgt("bb").pin(BB).sample(1024).FS(1e6).execute( ); //capture 1024
    points
    test.dc( ).pin("vdd").vForce(3 V).execute( ); //force voltage
    test.dc("ref").pin("VREF").vMeas( ).execute( ); //measure voltage
    test.digCap("dcap").pin("DPO").sample(100).execute( ); //capture
    samples
  TEST_END( );
ON_FIRST_INVOCATION_END( );
double i= test.id("bb").getComplexWaveform( );
ARRAY_I vec= test.id("dcap").getVector( );
double v= test.id("ref").getValue("VREF").
```

Figure 7:
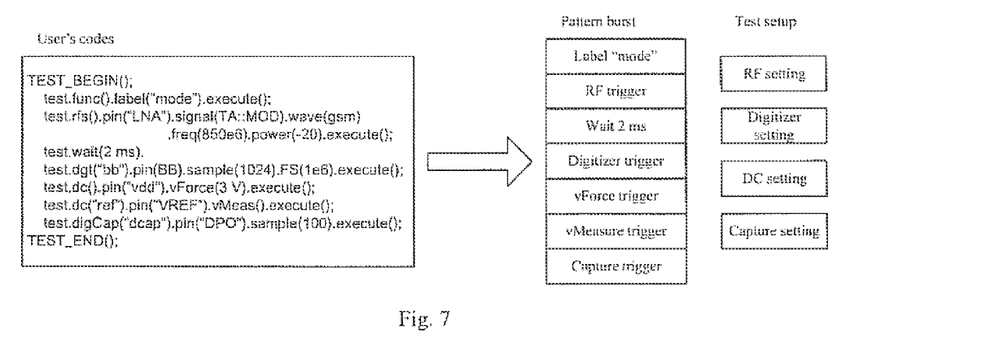
FIG. 7 illustrates exemplary automatic pattern generation and test setup generation from test programs according to an embodiment of the disclosure.

FIG. 7 illustrates exemplary automatic pattern generation and test setup process for a test based on high-level language code according to an embodiment of the present disclosure. As shown in FIG. 7, the code is processed by the methods described with reference to FIGS. 5-6, and results in the generation of a corresponding pattern burst which is used to automatically configure the ATE or the instruments thereof for the test.

Embodiments of the present disclosure advantageously allow a user to define a test by developing an integrated program in high level language. Embodiments of the present disclosure utilize TEST-oriented programming rather than the conventional TESTER-oriented programming, which frees a user from directly dealing with software/hardware specifics. Rather, the user can conveniently define a test by generating code through a common user-interface, including defining various types of events related to DC, analogy, digital, RF, and the like. This eliminates the need to manually set up the test through a variety of GUI windows and iteratively align the commands.

According to the present disclosure, a pattern-controlled test can be automatically configured based on a high-level language test program (as opposed to manually according to the prior art), which effectively improves test throughput and productivity. In addition, code generated according to the present disclosure allows easy switching between a single step execution (e.g. for debug purpose) and a burst pattern execution (e.g. for a real test).

Although an exemplary test for an RF transceiver chip response in a GSM system, upon receiving stimulation, is described above, the present disclosure is not limited to any specific test or DUT.

As another example, the following codes may be used for testing a power management IC (PMIC) item:

```
TEST_BEGIN( );
  test.dc( ).pin("D1VDD").iForce(-2 mA).execute( );
  test.prt( ).protocol("I2C").addr(0x02).write(0xa1);
  test.dc("im1").pin("BUCK1").vForce(1.8V).iRange(10uA).iMeas( ).
  execute( );
  test.prt( ).protocol("I2C").addr(0x02).write(0xa2);
  test.dc("im2").pin("BUCK2").vForce(1.8V).iRange(10uA).iMeas( ).
  execute( );
  test.prt( ).protocol("I2C").addr(0x02).write(0xb1);
  test.dc("vm").pin("LDO1").iForce(0.0).vMeas( ).execute( );
TEST_END( );
```

According to an embodiment of the disclosure, a set of APIs are provided, which are referred to as Smart Rapid Development Interface (SmartRDI) herein. With SmartRDI, the user can conveniently generate code by invoking the functions provided by the APIs similar to the above. The code is processed by the test control device 20 according to the method described above in connection with FIG. 5 to configure the ATE 30 for the test. The SmartRDI provides a simplified programming interface for a user to program a test, and allows automated generation and configuration of a pattern-based burst that includes various types of events, e.g. DC, analog, RF, digital, protocol, etc. SmartRDI thus enables faster time-to-market with competitive throughput. SmartRDI can be installed in any Pattern-Controlled ATE or on a work station without introducing hardware modifications. The SmartRDI can be stored in a non-volatile computer readable medium, e.g. the storage 430 in FIG. 4.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. Any claimed embodiment of the invention does not necessarily include all of the objects or embodiments of the disclosure.

What is claimed is:

1. A computer implemented testing method of testing an electronic device with an automatic testing equipment (ATE), said method comprising:
    accessing a test program coded in a high level programming language;
    identifying a plurality of operational events defined in said test program;
    based on said test program, classifying said plurality of operational events into one or more operational types;
    assigning a pattern label to each operational type of said one or more operational types;
    inserting each operational event of said plurality of operational events to a corresponding pattern label; and
    aggregating pattern labels into a pattern burst, wherein said pattern burst is used for testing said electronic device using said ATE.

2. The computer implemented testing method according to claim 1, wherein said one or more operational types are selected from a group consisting of a direct-current (DC)

operation type, an analog operation type, a digital operation type, an radio frequency (RF) operation type, and a protocol operation type.

3. The computer implemented testing method according to claim 1, wherein said high level language is selected from a group consisting of: C, C++, Java, .NET and a combination thereof.

4. The computer implemented testing method according to claim 1 further comprising supplying the pattern burst to a diagnostic instrument in said ATE, wherein said diagnostic instrument is configured to generate stimulus signals for application to a device under-test (DUT) based on said pattern burst.

5. The computer implemented testing method according to claim 1, wherein said assigning and said inserting are performed subsequent to said classifying.

6. The computer implemented testing method according to claim 1, wherein said assigning and said inserting are performed in parallel.

7. The computer implemented testing method according to claim 1, wherein said test program is configured to interact with a set of application programming interfaces (APIs).

8. The computer implemented testing method according to claim 7, wherein said set of APIs are stored in a test control device coupled to said ATE.

9. A non-transitory computer-readable medium storing instructions thereon that implement an application programming interface (API) for controlling an automatic testing equipment (ATE), wherein the API, when invoked in a software application executed on a processor, is configured to perform a method of:
 accessing said software application configured to control said ATE to perform a test process, wherein said software application is coded in a high level language;
 identifying a plurality of operational events defined in said test process based on said software application;
 determining respective operational types of said plurality of events;
 generating pattern labels for said respective operational types;
 associating each of said plurality of operational events to a corresponding pattern label; and
 generating a pattern burst comprising said pattern labels, wherein said pattern burst is for testing an electronic device using said ATE.

10. The non-transitory computer-readable medium of claim 9, wherein said respective operational types are selected from a group consisting of a direct-current (DC) operation type; an analog operation type, a digital operation type, an radio frequency (RF) operation type, and a protocol operation type.

11. The non-transitory computer-readable medium of claim 9, wherein said high level language is selected from a group consisting of: C, C++, Java, .NET and a combination thereof.

12. The non-transitory computer-readable medium of claim 9, wherein said method further comprises supplying the pattern burst to a diagnostic instrument in said ATE, wherein said diagnostic instrument is configured to generate stimulus signals to said electronic device based on said pattern burst.

13. The non-transitory computer-readable medium of claim 9, wherein said generating said pattern labels and said associating are performed subsequent to said determining.

14. The non-transitory computer-readable medium of claim 9, wherein said generating said pattern labels and said associating are performed in parallel.

15. The non-transitory computer-readable medium of claim 9, wherein said API is stored in a pattern control device coupled to said ATE.

16. An automatic testing equipment comprising:
 a diagnostic instrument;
 a pattern controller coupled to said diagnostic instrument and configured to automatically control said diagnostic instrument, wherein said pattern controller comprises:
  a processor;
  memory coupled to said processor and comprising instructions, when executed by said processor, implement an application programming interface (API) for controlling said diagnostic instrument, wherein the API, when invoked in a software application executed on a processor, is configured to perform a method of:
   accessing said software application configured to control said ATE to perform a test process, wherein said software application is coded in a high level language;
   identifying a plurality of operational events defined in said test process based on said software application;
   determining respective operational types of said plurality of events;
   generating pattern labels for said respective operational types;
   associating each of said plurality of operational events to a corresponding pattern label; and
   generating a pattern burst comprising said pattern labels, wherein said pattern burst is used for testing an electronic device using said ATE.

17. The system according to claim 16, wherein said respective operational types are selected from a group consisting of a direct-current (DC) operation type, an analog operation type, a digital operation type, an radio frequency (RE) operation type, and a protocol operation type.

18. The system according to claim 16, wherein said method further comprises supplying the pattern burst to a diagnostic instrument in said ATE, wherein said diagnostic instrument is configured to generate stimulus signals to a device under-test (DUT) based on said pattern burst.

19. The system according to claim 16, wherein said generating said pattern labels and said associating are performed subsequent to said determining.

20. The system according to claim 16, wherein said generating said pattern labels and said associating are performed in parallel.

* * * * *